(12) United States Patent
Galy et al.

(10) Patent No.: US 10,211,201 B2
(45) Date of Patent: Feb. 19, 2019

(54) DEVICE FOR PROTECTION AGAINST ELECTROSTATIC DISCHARGES WITH A DISTRIBUTED TRIGGER CIRCUIT

(71) Applicant: STMicroelectronics SA, Montrouge (FR)

(72) Inventors: Philippe Galy, Le Touvet (FR); Sotirios Athanasiou, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/914,387

(22) Filed: Mar. 7, 2018

(65) Prior Publication Data

US 2018/0197848 A1    Jul. 12, 2018

Related U.S. Application Data

(63) Continuation of application No. 15/497,993, filed on Apr. 26, 2017, now Pat. No. 9,947,650.

(30) Foreign Application Priority Data

Oct. 10, 2016  (GR) ............................. 20160100522

(51) Int. Cl.
*H01L 27/02* (2006.01)
*H01L 27/06* (2006.01)
*H01L 27/12* (2006.01)
*H01L 29/45* (2006.01)

(52) U.S. Cl.
CPC ...... *H01L 27/0266* (2013.01); *H01L 27/0629* (2013.01); *H01L 27/1203* (2013.01); *H01L 29/456* (2013.01)

(58) Field of Classification Search
CPC .................. H01L 27/0266; H01L 27/0285
USPC .......................................................... 257/360
See application file for complete search history.

(56) References Cited

U.S. PATENT DOCUMENTS 9,019,666 B2    4/2015  Bourgeat et al.
9,947,650 B1*   4/2018  Galy ................. H01L 27/0266
2007/0253126 A1  11/2007  Gauthier, Jr. et al.
(Continued)

FOREIGN PATENT DOCUMENTS

GB    2304994 A    3/1997
WO    9304518 A1    3/1993

OTHER PUBLICATIONS

INPI Search Report and Written Opinion for FR 1661085 dated Aug. 13, 2018 (6 pages).

*Primary Examiner* — Mark Prenty
(74) *Attorney, Agent, or Firm* — Crowe & Dunlevy (57) ABSTRACT

An ESD protection device includes a MOS transistor connected between a first terminal and a second terminal and having a gate region, source/drain region and a well region electrically coupled by a resistive-capacitive circuit configured to control turn on of the MOS transistor in response to an ESD event. The resistive-capacitive circuit has a common part with at least one of the source, gate or drain regions of the MOS transistor and includes a capacitive element and a resistive element. A first electrode of the capacitive element is formed by the resistive element and a second electrode of the capacitive element is formed by at least a portion of a semiconductor film within which the source/drain region is formed.

22 Claims, 3 Drawing Sheets

(56) References Cited

U.S. PATENT DOCUMENTS

2010/0001347 A1 1/2010 Sugiura
2017/0012043 A1 1/2017 Galy et al.

* cited by examiner

DEVICE FOR PROTECTION AGAINST ELECTROSTATIC DISCHARGES WITH A DISTRIBUTED TRIGGER CIRCUIT

CROSS REFERENCE TO RELATED APPLICATIONS

This application is a continuation of U.S. application patent Ser. No. 15/497,993 filed Apr. 26, 2017, which claims the priority benefit of Greece Application for Patent No. 20160100522, filed on Oct. 10, 2016, the disclosures of which are hereby incorporated by reference.

TECHNICAL FIELD

Various embodiments relate to electronic devices, and notably those designed for the protection of integrated components against electrostatic discharges (or ESD, according to an acronym well known to those skilled in the art).

BACKGROUND

In the field of micro-electronics, an electrostatic discharge generally results in a current spike that can be more or less intense flowing between two terminals of one or more components, associated with an increase in the voltage across the terminals of the component, and which could damage this or these components.

A device for protection against electrostatic discharges aims to absorb this current spike as much as possible in order to avoid the flow of this current within the component, while at the same time reducing the potential drop across its terminals in order to be compatible with the component to be protected.

There exist several solutions for the design of a device for protection against electrostatic discharges. A hybrid MOS transistor may, for example, be used such as that described in U.S. Pat. No. 9,019,666 (PCT/EP2011/050740), incorporated by reference, associated with a trigger circuit.

For example, this trigger circuit may be a resistive-capacitive circuit coupled to the control electrode of the MOS transistor.

In bulk substrate transistor technologies, the resistive-capacitive circuit may comprise the drain-gate and drain-substrate capacitances of the MOS transistor, and a resistor external to the MOS transistor coupled between ground and a terminal common to the substrate and to the gate of the MOS transistor. The use of the intrinsic capacitances of the transistor allows advantageously a gain of space.

However, in transistors fabricated on substrates of the SOI (Silicon-On-Insulator) type, these capacitances are greatly reduced and hence insufficient to be used as a capacitor for the resistive-capacitive trigger circuit.

On the one hand, the drain-substrate capacitance is greatly reduced owing to the smaller drain-substrate contact surface area, and on the other hand, the drain-gate capacitance is also reduced owing to the drain contact being made on an epitaxial region, further from the gate region.

Thus, when an electrostatic discharge occurs on an MOS transistor fabricated on a substrate of the silicon-on-insulator type, the voltage across the terminals of the transistor increases significantly, and the transistor only becomes conducting by means of the drain-source capacitance when the voltage across its terminals reaches a very high value, for example 7 volts.

When the voltage of 7 volts is reached, the transistor becomes conducting, which simultaneously leads to a voltage drop across the terminals of the transistor and an increase in the current flowing through it. This phenomenon is known by those skilled in the art under the term 'snapback'.

It is therefore advantageous to limit this effect in order for the MOS transistor to trigger for lower voltages, and hence to be compatible with the load to be protected.

SUMMARY

Thus, a device is provided for protection against electrostatic discharges occurring on a substrate of the silicon-on-insulator type, comprising a resistive-capacitive trigger circuit occupying a reduced surface area and allowing a triggering of the transistor with a greatly attenuated 'snapback', or even with no snapback effect. According to one aspect, a device is provided for protection against electrostatic discharges, fabricated in and on a semiconductor film situated on a buried isolation layer, itself situated on top of a semiconductor well, and comprising a first terminal and a second terminal.

The device also comprises at least one module comprising at least one MOS transistor connected between the first terminal and the second terminal and having its gate region, its substrate (or body) and the said well electrically coupled.

The module also comprises at least one resistive-capacitive circuit configured to render the MOS transistor conducting when an electrostatic discharge occurs on the first terminal or on the second terminal.

The at least one resistive-capacitive circuit has a common part with at least one of the source, gate or drain regions of the transistor and comprises a capacitive element and a resistive element, a first electrode of the capacitive element comprising the resistive element and a second electrode of the capacitive element comprising at least a portion of the semiconductor film.

The resistive circuit here is therefore formed on the transistor, since it has a common part with at least one of the source, gate or drain regions of the transistor. Furthermore, it is particularly compact since a first electrode of the capacitive element comprises the resistive element and a second electrode of the capacitive element comprises at least a portion of the semiconductor film. This is advantageous in terms of surface area occupied with respect to a specific resistive-capacitive circuit fabricated separately.

Furthermore, this resistive-capacitive circuit, referred to as "distributed", here comprises the trigger circuit for the protection device and is particularly effective with regard to the attenuation of the snapback effect. The capacitive coupling of such a circuit is furthermore improved with respect to a conventional resistive-capacitive circuit.

When the resistive-capacitive circuit has a common part with the drain region of the transistor, it is particularly effective for the protection against an ESD discharge propagating from the drain towards the source.

When the resistive-capacitive circuit has a common part with the source region of the transistor, it is particularly effective for the protection against an ESD discharge propagating from the source towards the drain.

The presence of these two capacitive circuits renders the protection device symmetrical vis-à-vis the propagation of the ESD discharge.

When the resistive-capacitive circuit has a common part with the gate region of the transistor, it improves the capacitive coupling and allows a triggering of the device for low voltages. Indeed, although the signal transmitted by the drain-gate capacitance of the transistor is too weak to trigger a conventional protection module fabricated on a substrate of the FDSOI type, this signal is nevertheless sufficient for triggering the module comprising this resistive-capacitive circuit.

According to one embodiment, the gate region comprises a first polysilicon region and the module comprises a first dummy gate region situated on top of the drain region of the transistor and comprising a second polysilicon region formed on top of a first insulating layer.

The second polysilicon region is electrically coupled to the first polysilicon region of the gate and comprises a first portion without any metal silicide.

The module then comprises a first resistive-capacitive circuit comprising a resistive element comprising the said first portion of the second polysilicon region and a capacitive element whose first electrode comprises the second polysilicon region and whose second electrode comprises a portion of the drain region situated under the first insulating layer.

In this embodiment, the resistive-capacitive circuit has a common part with the drain region of the transistor.

According to another possible embodiment, the gate region comprises a first polysilicon region situated on top of an insulating layer and comprises a portion without any metal silicide, and the module may then comprise a second resistive-capacitive circuit comprising a resistive element comprising the said portion without any metal silicide of the first polysilicon region of the gate region and a capacitive element whose first electrode comprises the first polysilicon region of the gate region and whose second electrode comprises a portion of the substrate region situated under the insulating layer.

In this other embodiment, the second resistive-capacitive circuit has a common part with the gate region and the substrate region of the transistor.

According to another embodiment, the gate region comprises a first polysilicon region and the module comprises a second dummy gate region situated on top of the source region and comprising a third polysilicon region situated on a third insulating layer.

The third polysilicon region is electrically coupled to the first polysilicon region and comprises a portion without any metal silicide.

The module comprises a third resistive-capacitive circuit comprising a resistive element comprising the said portion of the third polysilicon region without any metal silicide and a capacitive element whose first electrode comprises the third polysilicon region and whose second electrode comprises a portion of the source region situated facing the third insulating layer.

In this other embodiment, the third resistive-capacitive circuit has a common part with the source region of the transistor.

According to yet another embodiment, the well comprises a region less heavily doped than a layer situated under the buried isolation layer, and the module comprises a fourth resistive-capacitive circuit electrically coupled to the substrate of the transistor, having a resistive element comprising the less heavily doped region of the well and a capacitor whose first electrode comprises the said less heavily doped region of the well and whose second electrode comprises the semiconductor film situated on top of the buried isolation layer.

In this other embodiment, the fourth resistive-capacitive circuit has a common part with at least the substrate region of the transistor and allows, in combination with at least one of the preceding embodiments, the substrate of the transistor to be biased via the back face of the transistor, and hence advantageously allows the electrical performance characteristics of the transistor to be improved when an electrostatic discharge occurs.

Of course, some or all of these various embodiments may be combined.

The device may comprise a plurality of modules coupled in parallel between the first terminal and the second terminal.

The resistive-capacitive circuits of individual transistors belonging to separate modules may be electrically coupled.

According to another aspect, an integrated circuit is provided that incorporates a protection device such as defined hereinbefore.

In an embodiment, an integrated circuit comprises: a first terminal; a second terminal; a MOS transistor having a source and drain coupled to the first terminal and second terminal, respectively, and further having a front gate and a back gate; and a resistive-capacitive circuit configured to control turn on of the MOS transistor in response to an electrostatic discharge at one of the first terminal and the second terminal. The resistive-capacitive circuit comprises: a capacitor having a first plate formed by a portion of one of the source or drain and a second plate formed by a first polysilicon line insulated from the portion of the source or drain by a capacitor dielectric layer, said first polysilicon line forming a resistor having a first terminal forming a second plate of the capacitor and electrically coupled to the front gate and a second terminal electrically coupled to the back gate.

In an embodiment, an integrated circuit comprises: a first terminal; a second terminal; a MOS transistor having a source region and drain region coupled to the first terminal and second terminal, respectively, and further having a front gate and a back gate; and an insulated conductive line extending over one of said source or drain region, said insulated conductive line having a first electrical connection to the front gate and a second electrical connection to the back gate; wherein the insulated conductive line forms a resistive element extending between the first and second electrical connections; and wherein a capacitive element includes a first electrode formed by said insulated conductive line and a second electrode formed by said one of the source or drain region.

BRIEF DESCRIPTION OF THE DRAWINGS

Other advantages and features of the invention will become apparent from the detailed description of non-limiting embodiments and from the appended drawings in which.

DETAILED DESCRIPTION

Figure 1:
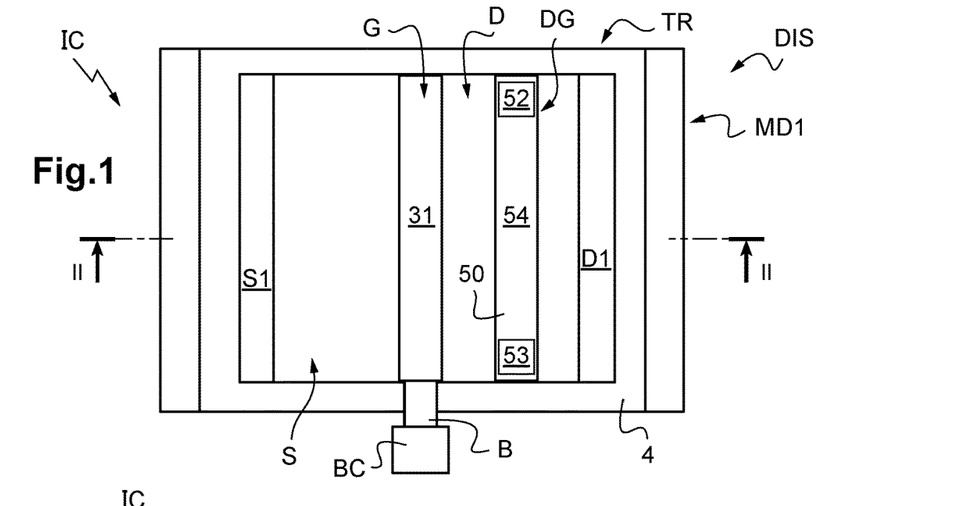
FIG. 1 is a schematic top view of a device for protection against electrostatic discharges.
Figure 2:
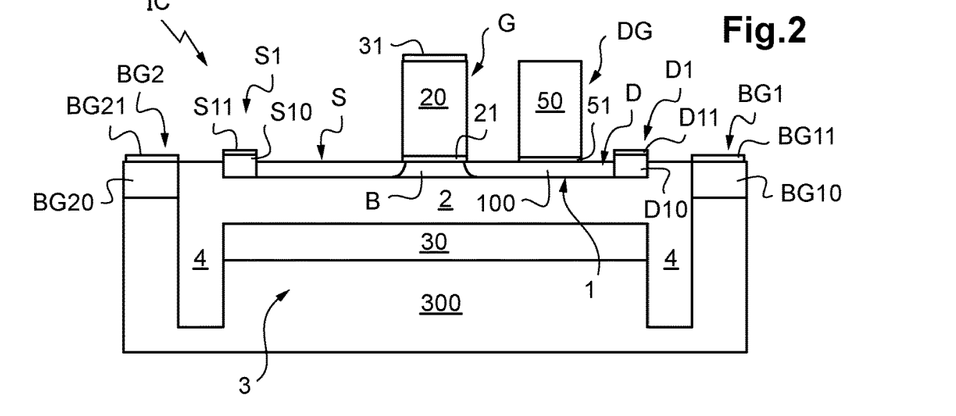
FIG. 2 is a cross-sectional view along the cross-section line II-II in FIG. 1.

FIG. 1 shows a schematic top view of a device DIS for protection against electrostatic discharges according to one embodiment, and FIG. 2 is a cross-sectional view along the cross-section line II-II in FIG. 1.

The device DIS, fabricated within an integrated circuit IC, comprises a module MD1 including an MOS transistor TR, formed within and on a semiconductor film 1, itself situated on a buried isolation layer 2 (BOX, "Buried Oxide" according to the acronym well known to those skilled in the art). The transistor TR is therefore formed here on a substrate of the silicon-on-insulator type (SOI).

The silicon film may be fully depleted, the substrate then being of the Fully-Depleted Silicon-On-Insulator (FDSOI) type.

The silicon film may be partially depleted, the substrate then being of the Partially-Depleted Silicon-On-Insulator (PDSOI) type.

The transistor TR is formed on top of a semiconductor well 3 here with P-type doping, comprising a more heavily doped region 30 and a less heavily doped region 300.

The transistor TR here is bounded by an insulating region 4, for example a Shallow Trench Isolation (STI).

The transistor comprises a gate region G, comprising in this example a first polysilicon track 20 situated on a first oxide layer 21 disposed on the semiconductor film 1. The gate region G here comprises a metal silicide 31 formed on the polysilicon track 20 and allowing the formation of contact points and a uniform biasing of the gate region G.

The transistor also comprises a source region S and a drain region D. These two regions are formed by N-type doping (for example) of the semiconductor film 1.

The source region S comprises a source electrical contact area S1 comprising a first epitaxial region S10 with heavy N-type doping (for example) and on which a first metal silicide S11 has been formed.

Similarly, the drain region D comprises a drain electrical contact area D1 comprising a second epitaxial region D10 with heavy N-type doping (for example) and on which a second metal silicide D11 has been formed. The epitaxial regions S10 and D10 allow the formation of contact areas on the drain D and source S regions, despite the reduced thickness of the semiconductor film 1 which is notably the case for FDSOI substrates.

The source S and drain D regions here are particularly long and comprise a part without any metal silicide, which is conventional in MOS transistors, and are designed to absorb electrostatic discharges. This advantageously allows the material of the semiconductor film 1 to behave as a ballast resistance and not to be damaged when the discharge passes through the transistor.

The region of the semiconductor film 1 situated between the source S and drain D regions, with P-type doping (for example), will be denoted in the following part of the description as the body B of the transistor TR. It is in this region that the channel of the transistor is formed.

The body B of the MOS transistor here extends beyond the gate region G, in such a manner as to form a body electrical contact area BC, shown here schematically, and allowing the body B to be biased. The body contact point could also, for example, be formed by means of an additional transistor lacking a junction, such as that described in the United States Patent Application Publication No. 20170012043 (incorporated by reference). It would also be possible to bias the substrate via an N-doped back gate, which would allow both an electrostatic control of the transistor and a biasing of the substrate.

The module MD1 comprises a first well electrical contact area BG1 and a second well electrical contact area region BG2, respectively comprising a first area BG10 with a heavy P-type doping (for example) on which a third metal silicide BG11 is formed, and a second region BG20 with a heavy P-type doping (for example) on which a fourth metal silicide BG21 is formed.

These two electrical contact regions BG1 and BG2 allow the well 3 of the transistor TR to be biased and, as a consequence, the highly-doped region 30, which then serves as a back gate for the transistor TR.

In this example, the transistor TR furthermore comprises a dummy gate region DG formed on the drain region D, between the gate region G and the drain electrical contact area D1.

The dummy gate region DG comprises a second polysilicon track 50, formed on a second oxide layer 51 disposed on the semiconductor film 1 on top of a region 100 of the drain D of the transistor TR.

The dummy gate region DG comprises a first electrical contact area 52 and a second electrical contact area 53, each situated at one end of the second polysilicon track 50 and each comprising a metal silicide. The portion 54 of the polysilicon track 50 situated between the two gate electrical contact regions 52 and 53 is, on the other hand, lacking any metal silicide.

Figure 3:
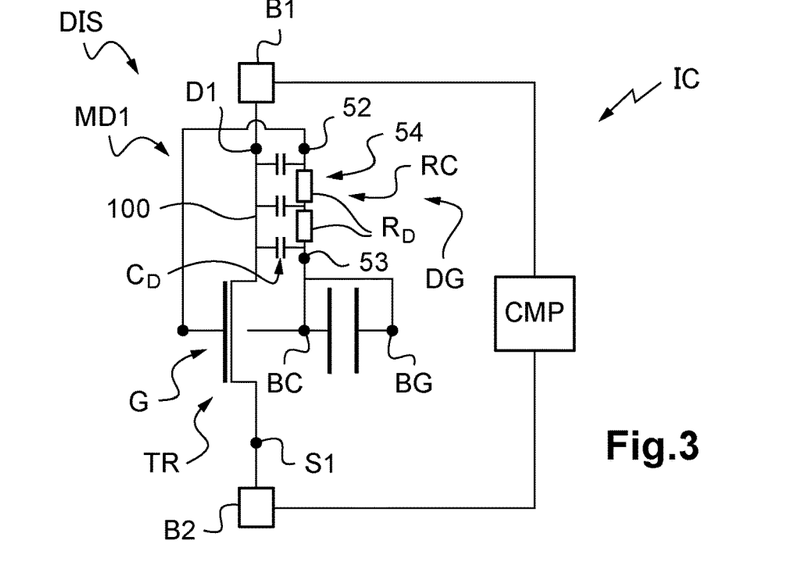
FIGS. 3-6 schematically illustrate, from an electrical point of view, a protection module of the type shown in FIGS. 1 and 2.

FIG. 3 illustrates schematically, from an electrical point of view, the module MD1 according to the embodiment previously described and illustrated in FIGS. 1 and 2.

In the following part of the description, the electrical connections between the various elements of the module, which have not previously been shown or described in relation with FIGS. 1 and 2, are formed by means of vias and of metal tracks situated in the interconnection part of the circuit (or BEOL, acronym for 'Back End Of Line' well known of those skilled in the art), which has not been shown in FIGS. 1 and 2 for the sake of simplification.

The module MD1 comprises a first terminal B1 and a second terminal B2 coupled to a component CMP of the integrated circuit IC that it is desired to protect against an electrostatic discharge. In this example, the drain D of the transistor TR is coupled to the first terminal B1 via the drain electrical contact area D1 and the source S of the transistor TR is coupled to the second terminal B2 via the source electrical contact area S1.

In the absence of the protection device DIS, an electrostatic discharge arriving for example on the first terminal B1 would flow towards the second terminal B2 passing through the component, which would risk damaging it.

Here, the gate G, the body B and the well 3 of the transistor TR are electrically coupled.

The first electrical contact area 52 is electrically coupled to the gate G, and the second electrical contact area 53 is electrically coupled to the body B and to the well 3 of the transistor TR.

The module MD1 comprises a resistive-capacitive circuit RC, whose resistance $R_D$ comprises the portion 54 of the second polysilicon track 50 situated between the first electrical contact area 52 and the second electrical contact area 53 of the dummy gate region DG. Indeed, since this portion 54 is lacking any metal silicide, it has a higher electrical resistance.

The capacitor $C_D$ of the resistive-capacitive circuit RC is the capacitor comprising the second oxide layer 51, the second polysilicon track 50 and the portion 100 of the drain region situated under the second oxide layer 51.

Thus, the dummy gate region DG and the semiconductor film 1 form a resistive-capacitive circuit RC comprising a capacitive element $C_D$ one of whose electrodes comprises the resistance $R_D$, the other electrode comprising the portion 100 of the semiconductor film 1. The circuit RC is therefore here formed on the transistor TR, which is advantageous in terms of surface area occupied with respect to a specific circuit RC fabricated separately and allows an improved capacitive coupling.

This resistive-capacitive circuit RC here comprises the trigger circuit for the device DIS.

The resistive-capacitive circuit RC thus formed is referred to as "distributed". It should be noted that here it is represented schematically: the number of resistors and the number of capacitors shown on the circuit diagram in FIG. 3 are not important, but respectively symbolize the resistance $R_D$ of the portion of polysilicon 24 and the capacitor $C_D$ comprising the dummy gate and the semiconductor film 1.

When an electrostatic discharge occurs between the first terminal B1 and the second terminal B2, the electrostatic discharge is transmitted by means of the capacitor $C_D$ and of the resistance $R_D$ onto the gate G, onto the body B and onto the well BG of the transistor TR.

By virtue of a hybrid operation of the transistor conjugating an MOS effect and a bipolar effect, this allows the discharge to flow through the transistor TR rather than in the component CMP.

Indeed, on the one hand, the biasing of the body B allows an operation of a bipolar transistor whose emitter is the source S, whose base is the body B, and whose collector is the drain D, and on the other hand, the biasing of the gate G allows a conventional operation of the MOS transistor The inventors have observed that this embodiment allows a very high attenuation of the snapback effect.

Figure 4:
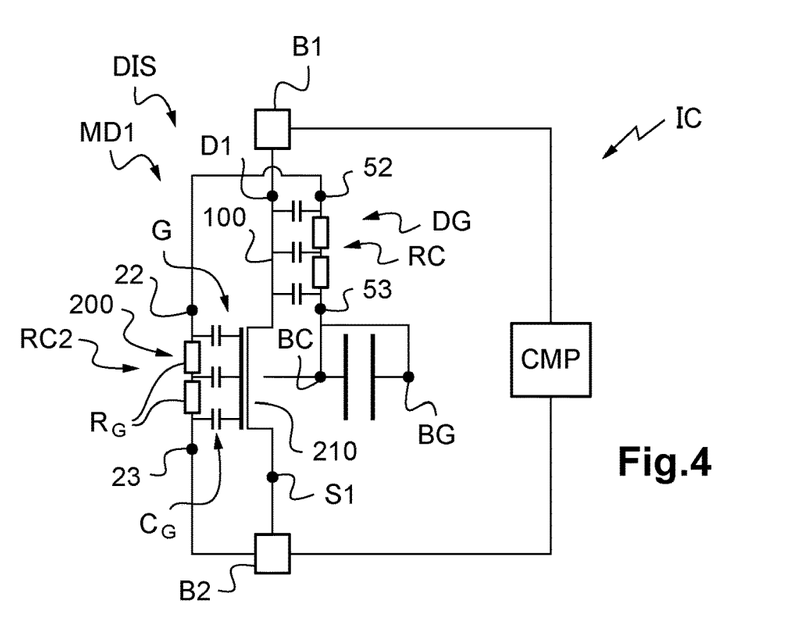

FIG. 4 illustrates one embodiment in which the gate G of the transistor TR has been formed in a manner analogous to the dummy gate DG, in such a manner as to form a second resistive-capacitive circuit RC2.

Thus, the first polysilicon track 20 here is lacking any metal silicide, with the exception of a first gate electrical contact area 22 and of a second gate electrical contact area 23 each situated at one end of the first polysilicon track 20. The portion of the first polysilicon track without any metal silicide is referenced 200. The first gate electrical contact area 22 and the first dummy gate electrical contact area 52 are electrically coupled, and the second gate electrical contact area 23 is coupled to the second terminal B2 and hence to the source S.

Here, the resistance $R_G$ of the second resistive-capacitive circuit RC2 comprises the portion 200 of the first polysilicon track 20 situated between the first gate electrical contact area 22 and the second gate electrical contact area 23. The capacitor $C_G$ of the second resistive-capacitive circuit RC2 comprises the capacitor comprising the second oxide layer 21, the first polysilicon track 20 and the substrate region 210 situated under the first oxide layer 21.

Here again, the second resistive-capacitive circuit RC2 comprises a capacitive element $C_G$ one of whose electrodes comprises the resistance $R_G$, the other electrode comprising the portion 210 of the semiconductor film 1.

This embodiment allows a different response of the transistor to an electrostatic discharge to be obtained, while at the same time avoiding the snapback phenomenon.

Those skilled in the art will be able to choose between this embodiment and that described in relation with FIGS. 1 to 3 depending on the characteristics of the component CMP to be protected.

Figure 5:
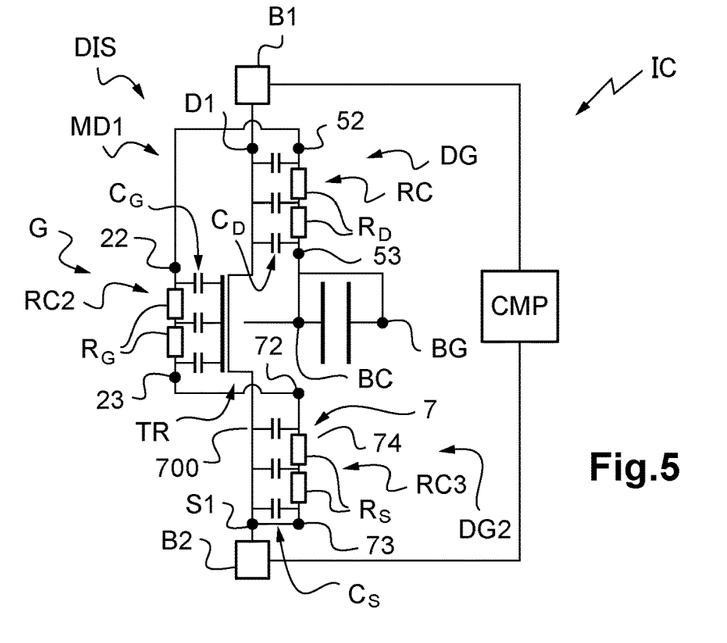

As illustrated in FIG. 5, it is also possible to form a third resistive-capacitive circuit RC3 using a second dummy gate region DG2, structurally analogous to the first dummy gate region DG, but situated on top of the source region S.

This second dummy gate region DG2 comprises a third polysilicon track 7 comprising a first electrical contact area 72 connected to the second gate electrical contact area 23 of the gate G, and a second electrical contact area 73 connected to the source electrical contact area S1. The portion of the third polysilicon track lacking any metal silicide is referenced 200. The resistance $R_S$ of this third resistive-capacitive circuit comprises the said portion 200, and the capacitor $C_S$ of this third circuit RC3 comprises the third polysilicon track 7, the portion 700 of the source region situated under the latter and a third insulating layer (gate oxide) situated between this third polysilicon track 7 and the said portion 700.

Here again, the third resistive-capacitive circuit RC3 comprises a capacitive element $C_S$ one of whose electrodes comprises the resistance $R_S$, the other electrode comprising the portion 700 of the semiconductor film 1. The presence of this third resistive-capacitive circuit RC3, in combination with the resistive-capacitive circuit RC, advantageously allows a symmetrical protection of the device, in other words a protection against electrostatic discharges flowing from the first terminal B1 towards the second terminal B2, and against electrostatic discharges flowing from the second terminal B2 towards the first terminal B1.

Figure 6:
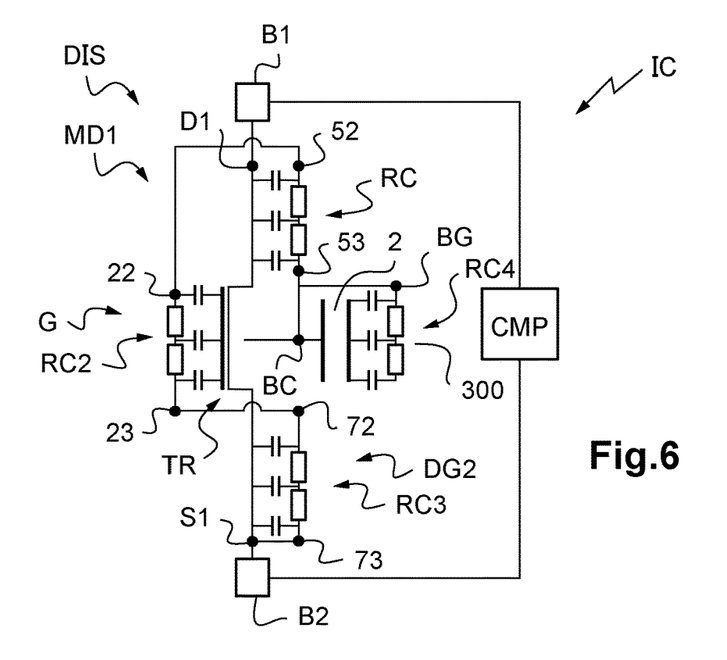

Furthermore, as FIG. 6 illustrates, it would also be possible to envisage a module MD1 comprising a fourth resistive-capacitive circuit RC4 electrically coupled to the body B of the transistor via the body electrical contact area BC.

The capacitor of this fourth resistive-capacitive circuit RC4 comprises the semiconductor film 1, the buried isolation layer 2 and the well 3 of the transistor TR. The resistance of this fourth resistive-capacitive circuit RC4 comprises the region 300 of the well, less heavily doped than the layer 30.

Here again, the fourth resistive-capacitive circuit RC4 comprises a capacitive element one of whose electrodes comprises the resistance of this capacitive circuit, the other electrode here comprising the semiconductor film 1. This fourth circuit, allows the body B to be biased via the back face of the transistor TR, and therefore advantageously allows the electrical performances of the MOS transistor TR to be improved when an electrostatic discharge occurs.

The embodiments presented here should not be seen as limiting in any way.

Thus, although a module MD1 not comprising the circuit RC has been described with reference to FIG. 3, it would be possible to envisage a module MD1 only comprising one of the resistive-capacitive circuits described hereinbefore, different from the circuit RC and selected from between the circuits RC2, RC3.

More particularly, in the case where the module MD1 comprises only the circuit RC2. It should be noted that the presence of the circuit RC2, which improves the capacitive coupling, allows the device to be triggered for low voltages. Thus, although the signal transmitted by the drain-gate capacitance is too weak for triggering a conventional protection module fabricated on a substrate of the FDSOI type, it is sufficient to trigger the module MD1 comprising the circuit RC2.

Similarly, although a module MD1 comprising two circuits RC and RC2 has been described with reference to FIG. 4, it would be possible to envisage a module MD1 comprising a combination of two resistive-capacitive circuits selected from amongst the circuits RC, RC2, RC3, RC4, with a combination different from the combination RC, RC2.

Similarly although a module MD1 comprising three circuits RC, RC2 and RC3 has been described with reference to FIG. 5, it would be possible of envisage a module MD1 comprising a combination of three resistive-capacitive circuits selected from amongst the circuits RC, RC2, RC3, RC4, with a combination different from the combination RC, RC2, RC3.

Figure 7:
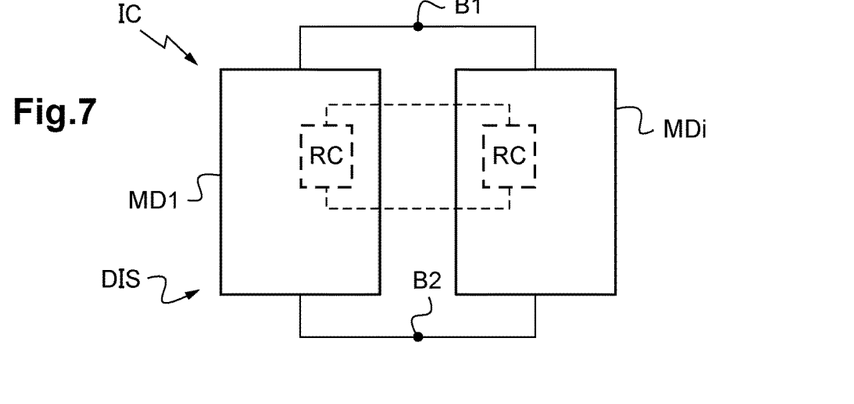
FIG. 7 shows a device comprising a plurality of protection modules coupled in parallel.

Furthermore, although a device DIS comprising a single module MD1 containing one MOS transistor and one or more distributed circuits RC has been described here, it would also be possible to envisage, as illustrated schematically in FIG. 7, a device comprising a plurality of modules MDi, coupled in parallel between the first terminal B1 and the second terminal B2.

In this case, it would also be possible to electrically couple the resistive-capacitive circuits of individual transistors belonging to separate modules, as shown schematically by the dashed lines in this FIG. 7.

Furthermore, although a module has been presented in which the connections between the gate region and the dummy gate region or regions are made by metal levels, it would also be possible to connect them via polysilicon regions formed between these regions and comprising a metal silicide.

Furthermore, the connections between various distributed resistive-capacitive circuits may be series connections, parallel connections, or a combination of series and parallel connections, depending on the optimization of the surface area and on the triggering sensitivity of the device targeted.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An integrated circuit, comprising:
a first terminal;
a second terminal;
a MOS transistor having a source and drain coupled to the first terminal and second terminal, respectively, and further having a front gate and a back gate; and
a resistive-capacitive circuit configured to control turn on of the MOS transistor in response to an electrostatic discharge at one of the first terminal and the second terminal;
wherein the resistive-capacitive circuit comprises:
a capacitor having a first plate formed by a portion of the drain and a second plate formed by a first polysilicon line insulated from the portion of the drain by a capacitor dielectric layer, said first polysilicon line forming a resistor having a first terminal electrically coupled to the front gate and a second terminal electrically coupled to the back gate.

2. The integrated circuit of claim 1, wherein the first polysilicon line includes a first silicide area that is electrically coupled to the front gate and a second silicide area that is electrically coupled to the back gate.

3. The integrated circuit of claim 1, wherein the front gate is formed by a second polysilicon line having a same thickness as said first polysilicon line.

4. The integrated circuit of claim 3, wherein the first and second polysilicon lines extend parallel to each other.

5. The integrated circuit of claim 1, wherein the source and drain are formed in a first semiconductor layer and the back gate is formed by a doped well within a second semiconductor layer that is isolated from the first semiconductor layer by an oxide layer.

6. The integrated circuit of claim 5, wherein the first semiconductor layer, oxide layer and second semiconductor layer are part of a silicon on insulator (SOI) substrate.

7. The integrated circuit of claim 1, further comprising:
a third terminal; and
a capacitive coupling between the third terminal and back gate.

8. An integrated circuit, comprising:
a first terminal;
a second terminal;
a MOS transistor having a source and drain coupled to the first terminal and second terminal, respectively, and further having a front gate and a back gate; and
a resistive-capacitive circuit configured to control turn on of the MOS transistor in response to an electrostatic discharge at one of the first terminal and the second terminal;
wherein the resistive-capacitive circuit comprises:
a capacitor having a first plate formed by a portion of the source and a second plate formed by a first polysilicon line insulated from the portion of the source by a capacitor dielectric layer, said first polysilicon line forming a resistor having a first terminal electrically coupled to the front gate and a second terminal electrically coupled to the back gate.

9. The integrated circuit of claim 8, wherein the first polysilicon line includes a first silicide area that is electrically coupled to the front gate and a second silicide area that is electrically coupled to the back gate.

10. The integrated circuit of claim 8, wherein the front gate is formed by a second polysilicon line having a same thickness as said first polysilicon line.

11. The integrated circuit of claim 10, wherein the first and second polysilicon lines extend parallel to each other.

12. The integrated circuit of claim 8, wherein the source and drain are formed in a first semiconductor layer and the back gate is formed by a doped well within a second semiconductor layer that is isolated from the first semiconductor layer by an oxide layer.

13. The integrated circuit of claim 12, wherein the first semiconductor layer, oxide layer and second semiconductor layer are part of a silicon on insulator (SOI) substrate.

14. The integrated circuit of claim 8, further comprising:
a third terminal; and
a capacitive coupling between the third terminal and back gate.

15. An integrated circuit, comprising:
a first terminal;
a second terminal;
a MOS transistor having a source region and drain region coupled to the first terminal and second terminal, respectively, and further having a front gate and a back gate; and
an insulated conductive line extending over said drain region, said insulated conductive line having a first electrical connection to the front gate and a second electrical connection to the back gate;
wherein the insulated conductive line forms a resistive element extending between the first and second electrical connections; and wherein a capacitive element includes a first electrode formed by said insulated conductive line and a second electrode formed by said drain region.

16. The integrated circuit of claim 15, wherein the insulated conductive line comprises a polysilicon line insulated from the drain region by an insulating layer.

17. The integrated circuit of claim 16, wherein the first terminal is formed by a first silicide region on the polysilicon line, and wherein the second terminal is formed by a second silicide region on the polysilicon line.

18. The integrated circuit of claim 17, wherein the first electrode is formed by a portion of the polysilicon line between the first and second silicide regions.

19. An integrated circuit, comprising:
   a first terminal;
   a second terminal;
   a MOS transistor having a source region and drain region coupled to the first terminal and second terminal, respectively, and further having a front gate and a back gate; and
   an insulated conductive line extending over said source region, said insulated conductive line having a first electrical connection to the front gate and a second electrical connection to the back gate;
   wherein the insulated conductive line forms a resistive element extending between the first and second electrical connections; and
   wherein a capacitive element includes a first electrode formed by said insulated conductive line and a second electrode formed by said source region.

20. The integrated circuit of claim 19, wherein the insulated conductive line comprises a polysilicon line insulated from the source region by an insulating layer.

21. The integrated circuit of claim 20, wherein the first terminal is formed by a first silicide region on the polysilicon line, and wherein the second terminal is formed by a second silicide region on the polysilicon line.

22. The integrated circuit of claim 21, wherein the first electrode is formed by a portion of the polysilicon line between the first and second silicide regions.

* * * * *